(12) United States Patent
Shearer et al.

(10) Patent No.: US 10,727,193 B2
(45) Date of Patent: *Jul. 28, 2020

(54) SINTERING PASTES WITH HIGH METAL LOADING FOR SEMICONDUCTOR DIE ATTACH APPLICATIONS

(71) Applicant: Ormet Circuits, Inc., San Diego, CA (US)

(72) Inventors: Catherine Shearer, San Diego, CA (US); Eunsook Barber, San Diego, CA (US); Michael Matthews, San Diego, CA (US)

(73) Assignee: ORMET CIRCUITS, INC., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/562,772

(22) PCT Filed: Apr. 27, 2016

(86) PCT No.: PCT/IB2016/052375
§ 371 (c)(1),
(2) Date: Sep. 28, 2017

(87) PCT Pub. No.: WO2016/174584
PCT Pub. Date: Nov. 3, 2016

(65) Prior Publication Data
US 2018/0358318 A1 Dec. 13, 2018

Related U.S. Application Data

(60) Provisional application No. 62/154,021, filed on Apr. 28, 2015.

(51) Int. Cl.
H01L 23/00 (2006.01)
B23K 1/00 (2006.01)
(Continued)

(52) U.S. Cl.
CPC ............ *H01L 24/29* (2013.01); *B23K 1/0016* (2013.01); *B23K 35/025* (2013.01);
(Continued)

(58) Field of Classification Search
CPC . H01L 24/29; H01L 23/488; H01L 23/49513; H01L 24/32; H01L 24/83; H01L 2224/29205; H01L 2224/29209; H01L 2224/29211; H01L 2224/29218; H01L 2224/29224; H01L 2224/29239; H01L 2224/29244; H01L 2224/29247; H01L 2224/29249; H01L 2224/29255; H01L 2224/29257; H01L 2224/2926; H01L 2224/29264; H01L 2224/29269; H01L 2224/29273; H01L 2224/2928; H01L 2224/29284; H01L 2224/29329; H01L 2224/29294; H01L 2224/29305; H01L 2224/29311; H01L 2224/29318; H01L 2224/29324; H01L 2224/29339; H01L 2224/29344; H01L 2224/29347; H01L 2224/29349; H01L 2224/29355; H01L 2224/29357; H01L 2224/2936; H01L 2224/29364; H01L 2224/29369; H01L 2224/29373; H01L 2224/2938; H01L 2224/29384; H01L 2224/32227; H01L 2224/83203; H01L 2224/8321; H01L 2224/83825; H01L 2224/8384; H01L 2924/01004; H01L 2924/01058; B23K 1/0016; B23K 35/0244; B23K 35/025; B23K 35/26; B23K 35/262; B23K 35/30; B23K 35/3006; B23K 35/3013; B23K 35/302; B23K 35/3026; B23K 35/3033; B23K 35/3046; B23K 35/3053;
(Continued)

(56) References Cited

U.S. PATENT DOCUMENTS 8,221,518 B2 7/2012 Shearer et al.
9,583,453 B2 2/2017 Shearer et al.
(Continued)

FOREIGN PATENT DOCUMENTS

TW 201411652 A 3/2014
WO 2008091825 A2 7/2008
(Continued)

OTHER PUBLICATIONS

International Search Report, PCT/IB2016/052375, dated Jul. 27, 2016.
China Office Action issued in China Patent Application No. 201680023639.9 dated Sep. 20, 2019 (national phase of PCT/IB2016/052375 filed on Apr. 27, 2016) with English translation.
English language translation of Office Action issued by TW Patent Office dated Oct. 21, 2019.
(Continued)

Primary Examiner — James C Goloboy
(74) Attorney, Agent, or Firm — Mitchell Brustein

(57) ABSTRACT

A semiconductor die attach composition with greater than 60% metal volume after thermal reaction having: (a) 80-99 wt % of a mixture of metal particles comprising 30-70 wt % of a lead-free low melting point (LMP) particle composition comprising at least one LMP metal Y that melts below a temperature T1, and 25-70 wt % of a high melting point (HMP) particle composition comprising at least one metallic element M that is reactive with the at least one LMP metal Y at a process temperature T1, wherein the ratio of wt % of M to wt % of Y is at least 1.0; (b) 0-30 wt % of a metal powder additive A; and (c) a fluxing vehicle having a volatile portion, and not more than 50 wt % of a non-volatile portion.

13 Claims, 2 Drawing Sheets

(51) Int. Cl.
| | |
|---|---|
| B23K 35/30 | (2006.01) |
| B23K 35/02 | (2006.01) |
| B23K 35/26 | (2006.01) |
| H01L 23/495 | (2006.01) |
| H01L 23/488 | (2006.01) |
| B23K 35/36 | (2006.01) |
| B23K 35/362 | (2006.01) |
| B23K 103/00 | (2006.01) |
| B23K 101/40 | (2006.01) |

(52) U.S. Cl.
CPC .......... *B23K 35/0244* (2013.01); *B23K 35/26* (2013.01); *B23K 35/262* (2013.01); *B23K 35/30* (2013.01); *B23K 35/302* (2013.01); *B23K 35/3006* (2013.01); *B23K 35/3013* (2013.01); *B23K 35/3026* (2013.01); *B23K 35/3033* (2013.01); *B23K 35/3046* (2013.01); *B23K 35/3053* (2013.01); *B23K 35/362* (2013.01); *B23K 35/3613* (2013.01); *H01L 23/488* (2013.01); *H01L 23/49513* (2013.01); *H01L 24/83* (2013.01); *B23K 2101/40* (2018.08); *B23K 2103/56* (2018.08); *H01L 24/32* (2013.01); *H01L 2224/2926* (2013.01); *H01L 2224/2928* (2013.01); *H01L 2224/2929* (2013.01); *H01L 2224/2936* (2013.01); *H01L 2224/2938* (2013.01); *H01L 2224/29205* (2013.01); *H01L 2224/29209* (2013.01); *H01L 2224/29211* (2013.01); *H01L 2224/29218* (2013.01); *H01L 2224/29224* (2013.01); *H01L 2224/29239* (2013.01); *H01L 2224/29244* (2013.01); *H01L 2224/29247* (2013.01); *H01L 2224/29249* (2013.01); *H01L 2224/29255* (2013.01); *H01L 2224/29257* (2013.01); *H01L 2224/29264* (2013.01); *H01L 2224/29269* (2013.01); *H01L 2224/29273* (2013.01); *H01L 2224/29284* (2013.01); *H01L 2224/29294* (2013.01); *H01L 2224/29305* (2013.01); *H01L 2224/29311* (2013.01); *H01L 2224/29318* (2013.01); *H01L 2224/29324* (2013.01); *H01L 2224/29339* (2013.01); *H01L 2224/29344* (2013.01); *H01L 2224/29347* (2013.01); *H01L 2224/29349* (2013.01); *H01L 2224/29355* (2013.01); *H01L 2224/29357* (2013.01); *H01L 2224/29364* (2013.01); *H01L 2224/29369* (2013.01); *H01L 2224/29373* (2013.01); *H01L 2224/29384* (2013.01); *H01L 2224/32227* (2013.01); *H01L 2224/8321* (2013.01); *H01L 2224/8384* (2013.01); *H01L 2224/83203* (2013.01); *H01L 2224/83825* (2013.01); *H01L 2924/01004* (2013.01); *H01L 2924/01058* (2013.01)

(58) Field of Classification Search
CPC .............. B23K 35/3613; B23K 35/362; B23K 2101/40; B23K 2103/56
See application file for complete search history.

(56) References Cited

U.S. PATENT DOCUMENTS

| | | | |
|---|---|---|---|
| 9,796,053 B2 | 10/2017 | Fujimaki | |
| 2010/0252616 A1* | 10/2010 | Shearer | B22F 1/0003 228/248.1 |
| 2011/0171372 A1* | 7/2011 | Shearer | B22F 3/10 427/123 |
| 2014/0042212 A1* | 2/2014 | Shearer | B23K 35/025 228/248.1 |
| 2014/0120356 A1 | 5/2014 | Shearer et al. | |

FOREIGN PATENT DOCUMENTS

| | | |
|---|---|---|
| WO | 2014082100 A1 | 5/2014 |
| WO | 2015050252 A1 | 4/2015 |

OTHER PUBLICATIONS

English translation of Taiwan Search Report issued in Taiwan Patent Application No. 105113321 dated Oct. 21, 2019.
English translation of WO2015/050252, published on Apr. 9, 2015.

* cited by examiner

SINTERING PASTES WITH HIGH METAL LOADING FOR SEMICONDUCTOR DIE ATTACH APPLICATIONS

This application is a United States National Stage Patent Application under 35 U.S.C. § 371 of International Patent Application No. PCT/IB2016/052375, filed Apr. 27, 2016, which claims priority to U.S. Provisional Patent Application No. 62/154,021, filed Apr. 28, 2015, the contents of each of which are being hereby incorporated herein by reference.

FIELD OF INVENTION

The present invention relates to metal compositions, methods of preparation thereof and uses therefor. More specifically, the present invention relates to metal compositions, methods of preparation thereof and uses therefor for the attachment of semiconductor die to packaging elements.

BACKGROUND

In the production of electronic devices, semiconductor die are assembled onto substrates to create a platform for interconnecting the die signal input and output functions to the other devices with which it will communicate. Typically, this assembly is effected with specifically designed solders and/or polymer adhesive disposed between the non-functional side of the die and the substrate.

In certain subsets of semiconductor die (typically used for power management or lighting applications), the sides of the die attached to the substrate are metallized to promote good thermal transfer between the operating semiconductor die and the substrate, and, in some cases, electrical interconnection as well. Silicon-based semiconductor die fabricated for power applications are typically metallized in this fashion in order to achieve both an electrical and thermal connection to the backside of the die. As device operating temperatures increase, additional materials, such as silicon carbide and gallium nitride, are being prepared in a similar fashion to improve device performance in elevated temperature environments For applications in which the heat to be dissipated from the die is relatively low, metal-particle-filled polymeric adhesives are the most common class of materials used to adhere the semiconductor die to the packaging element. In these adhesive systems, thermal and, if desired, electrical conduction propagates through various mechanisms based on the volume fraction of metal filler. Research (and industrial practice) has shown that conductive adhesives with a volume fraction of metal filler of approximately 30% can achieve low electrical resistivity and high thermal conductivity. However, conductive adhesives have inherent limitations on their electrical reliability performance, and thus their ability to replace soft solder, in semiconductor devices. Since the thermal and electrical conduction efficiency is directly dependent on the proportion of filler particles relative to the polymer adhesive content, there is an upper limit in conductivity for these adhesives resulting from the practical limitations on the amount of filler that can be incorporated without compromising the mechanical integrity of the adhesive.

For applications in which higher power dissipation is required, the use of solders or silver-based sintering materials are more common for semiconductor attachment in packaging elements. Traditionally, lead-based solders are used for the die attachment of power semiconductors because these solders wet well to the metallized die and package element(s), provide excellent electrical and thermal conductivity and have high elongation to mitigate the differences in coefficient of thermal expansion (CTE) between the semiconductor die and the package element(s). In the last decade, there has been an initiative to replace the lead-based solders with lead-free solders. For specialty applications, gold-tin, tin-antimony, indium or bismuth-based alloys are used, but these are often expensive and frequently have mechanical or electrical performance limitations. For more broad-based power die attach applications, tin-based solders have been evaluated as a Pb-free solution. Typically, these tin-based solders are applied in a paste or wire-based form. During thermal processing, the individual particles of tin-alloy melt and fuse to one another and the metallized surfaces to form a monolithic joint. As the individual particles collapse and consolidate into a single molten mass, the volatile flux vehicle is excluded from the mass resulting in large centralized pockets of void space from which the flux volatiles have been evacuated. These pockets can create hot spots on the semiconductor die due to the lack of thermal conduction in that locality, or reduced electrical performance of the device due to reduced area of electrical contact. Although these void pockets are endemic to both leaded and lead-free solders, in the lead-free solders subsequent thermal excursions can cause the alloy to remelt which can result in further consolidation of the void pockets into very large vacancies. Further, the lead-free tin-based alloys do not exhibit the elongation characteristic of the lead-based solders and therefore do not effectively mitigate the CTE mismatch between the semiconductor die and the package elements.

One class of materials proposed to meet the requirements for power semiconductors are known as silver sintering pastes. Silver sintering pastes are comprised of silver particles, often in nanometer or micrometer sizes, in combination with a carrier. During thermal processing, the high surface energy of the nano-sized silver particles is leveraged to sinter the silver particles together at a temperature far below the melting temperature of silver metal. Organometallic additives may also be used in the carrier composition to promote sintering performance. Applied pressure, not a typical manufacturing protocol for semiconductor attachment, is often required during the thermal processing to achieve a sufficiently consolidated and mechanically robust joint. While this class of materials offers many desirable characteristics, these expensive materials typically do not bond well to many packaging element surfaces that are increasingly popular for cost reasons.

Accordingly, the industry is currently in search of an alternative class of materials for the attachment of metallized semiconductor die onto package elements. The desired attributes of the new material class is the use of existing deposition and processing infrastructure; high thermal conductivity (>20 W/mK); stable electrical resistance, robust adhesion, mechanical and electrical reliability through multiple thermal excursions including standard industry reliability testing; low void volume and small sized voids in the joint; differential coefficient of thermal expansion (C 1E) mechanical stress management; and low cost.

SUMMARY OF THE INVENTION

In one of its aspects, the present invention relates to the attachment of metallized semiconductor die onto packaging elements such as clips, lead frames, substrates, interposers and leads such that a robust electrical and thermal interconnection is achieved. The compositions of the present invention are a new class of semiconductor assembly materials that possess all of the attributes desired for interconnection of semiconductor die for high power applications and remedy the deficiencies of prior art compositions.

The compositions of the present invention employ two or more types of metal particles combined with a fluxing organic vehicle to create a paste. The two or more types of metal particles are selected to react irreversibly at a particular process temperature to form a continuous metallurgically interconnected network from an attachment point on a metallized packaging element, through the bulk of the disposed composition, and terminating of a metallized connection point of a semiconductor die. The fluxing vehicle of the present invention serves to deliver the metal particles in a paste form, facilitates the reaction between the metal particles, and largely volatilizes during the thermal process resulting in a joint with an interconnected metal volume fraction equal to or greater than 60 percent. The high volume fraction of interconnected metal in the processed joint results in high, stable and reliable electrical and thermal performance that is comparable to solders. The high volume fraction of interconnected metal in the final joint also dominates the mechanical characteristics of the processed joint, thus overcoming the mechanical degradation issues of prior art metal-filled-polymer compositions. The cost of the constituent metal particles and the processing requirements are comparable to the solder materials that are the current industry standard.

In one embodiment, the compositions of the present invention may be described as:
a) a mixture of lead-free metal particles comprising:
  i) a low melting point (LMP) particle composition comprising a metal element Y; and
  ii) a high melting point (HMP) particle composition comprising metal M that is reactive with metal Y at a process temperature T1, and
b) a fluxing vehicle, wherein said fluxing vehicle comprises:
  i) a volatile portion, and
  ii) not more than 50 wt % of a non-volatile portion that becomes inert at T1.

DETAILED DESCRIPTION

Figure 1:
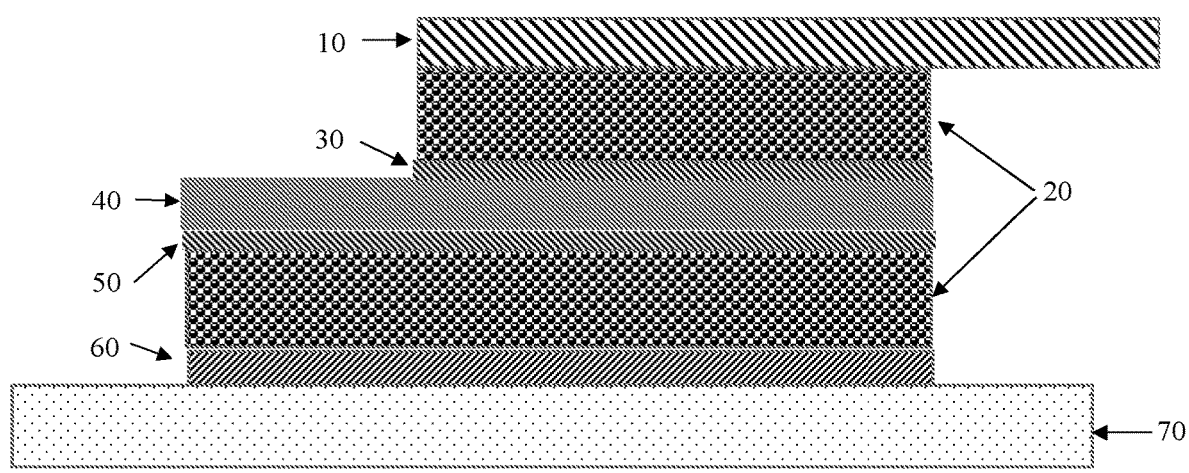
FIG. 1 depicts an exemplary use of the invention composition to connect one semiconductor die to two packaging elements.

It is to be understood that both the foregoing general description and the following detailed description are illustrative and explanatory, and are not restrictive of the subject matter, as claimed.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Unless specific definitions are provided, the nomenclatures utilized in connection with, and the laboratory procedures and techniques of materials science, metallurgy, metallurgical engineering, electronics, and chemistry described herein are those known in the art. Standard chemical symbols are used interchangeably with the full names represented by such symbols. Thus, for example, the terms "Tin" and "Sn" are understood to have identical meanings. Standard techniques may be used for metallurgical processing, soldering, chemical syntheses, chemical analyses, and formulation.

Definitions

In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements or components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

Furthermore, use of the term "including" as well as other forms, such as "includes," and "included," is understood as "comprising" and is not limiting. It is to be understood that as used in the specification and in the claims, the singular form of any word can also refer to the plural, depending upon the context in which it is used.

"About" or "approximately" as used herein, means that a number referred to as "about" or "approximately" comprises the recited number plus or minus 1-10% of that recited number. For example, about 50 degrees can mean 45-55 degrees or as few as 49-51 degrees depending on the situation.

Whenever it appears herein, a numerical range, such as "45-55", refers to each integer in the given range; e.g., "45-55%" means that the percentage can be 45%, 46%, etc., up to and including 55%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. For example, "substantially all" typically refers to at least about 90%, frequently at least about 95%, often at least 99%, and more often at least about 99.9%.

The term "alloy" refers to a mixture containing two or more metals, and optionally additional non-metals, where the elements of the alloy are fused together or dissolved into each other when molten. The notation used herein for alloy compositions lists two or more elements using their IUPAC symbols separated by a forward slash ("/"). When given, the proportions of the elements in the alloy are indicated by subscripts corresponding to the weight percent of the element in the alloy. For example, Sn/Bi represents an alloy of tin (Sn) and bismuth (Bi), which can be any proportion of these two elements. $Sn(60)/Bi(40)$ represents a specific alloy of tin and bismuth that contains 60 percent by weight of tin and 40 percent by weight of bismuth. Where a range is given for the weight percent of an element(s) in an alloy, the range indicates that the element can be present in any amount within the indicated range. For example, Sn(70-90)/Bi(10-30) refers to an alloy containing from 70 weight percent to 90 weight percent of tin, and from 10 weight percent to 30 weight percent of bismuth. Thus, alloys encompassed by the "Sn(70-90)/Bi(10-30)" range include, but are not limited to: Sn(70)/Bi(30), Sn(71)/Bi(29), Sn(72)/Bi(28), Sn(73)/Bi(27), Sn(74)/Bi(26), Sn(75)/Bi(25), Sn(76)/Bi(24), Sn(77)/Bi(23), Sn(78)/Bi(22), Sn(79)/Bi(21), Sn(80)/Bi(20), Sn(81)/Bi(19), Sn(82)/Bi(18), Sn(83)/Bi(17), Sn(84)/Bi(16), Sn(85)/Bi(15), Sn(86)/Bi(14), Sn(87)/Bi(13), Sn(88)/Bi(12), Sn(89)/Bi(11), and Sn(90)/Bi(10). Furthermore, Sn(70-90)/Bi(10-30) represents alloys in which the specific proportion of the elements Sn and Bi may vary from Sn(70)/Bi(30) to Sn(90)/Bi(10) inclusive of proportions of Sn varying from 70 up to 90 weight percent and Bi inversely varying from 30 down to 10 weight percent.

The term "pseudo alloy" refers to particulates comprising a mixture of metallic elements in which the metallic elements are not dissolved into one another when in molten form. A "pseudo alloy" particle is formed by co-solidifying elements from a non-solution molten state such that each particle comprises a mixture of the co-solidified elements.

"Flux" as used herein, refers to a substance, often an acid or base, used to promote fusing of metals and in particular, removes and prevents the formation of metal oxides.

The terms "melting temperature" or "melting point," as used herein, refer to the temperature (a point) at which a solid becomes a liquid at atmospheric pressure.

The terms "high melting temperature metal", "high melting point metal" or "HMP metal" as used herein, refer to a metal having a melting temperature that is equal to, or higher than, about 400° C. HMP metals include Cu, Ag, Pd, Au, Al, Ni, Be, Rh, Co, Fe, Mo, W, Mn and Pt. Typically, the HMP metal used in the compositions of the present invention is Cu, Ag, Pd, Au, Al, Ni or Pt, and most frequently the HMP metal is Cu, Ni or Ag.

The terms "low melting temperature metal", "low melting point metal" or "LMP metal" as used herein, refer to a metal having a melting temperature that is lower than about 400° C. Exemplary LMP metals include Sn, Bi, Zn, Ga, In, Te, Hg, Tl, Sb, Se, Po, Pb, Cd, and Po in an alloy of these metals. Typically, the LMP metal used in the compositions of the present invention is Sn, Ga, In or Zn in an alloy, and most frequently the LMP is Sn in an alloy.

The term "solidus" refers to the temperature below which a given substance is completely solid (crystallized). The solidus quantifies the temperature at which melting of a substance begins, but is not necessarily melted completely, i.e., the solidus is not necessarily a melting point. For this distinction, the solidus may be contrasted to the "liquidus", which specifies the maximum temperature at which crystals can co-exist with molten substance. Above the liquidus temperature, the material is homogeneous and liquid at equilibrium. Below the liquidus temperature, more and more crystals may form. The solidus and liquidus temperatures do not align or overlap in all cases. If a gap exists between the solidus and liquidus temperatures, it is called the "freezing range" or "mush range", and within that gap, the substance consists of a mixture of solid and liquid phases.

The term "eutectic" refers to a mixture or an alloy in which the constituent parts are present in such proportions that the constituents melt simultaneously, and the melting point is as low as possible. Accordingly, a eutectic alloy or mixture solidifies at a single temperature. In eutectic mixtures, the solidus and liquidus temperatures are identical, i.e., the mixture melts completely at one temperature, the eutectic point.

The term "non-eutectic" refers to a mixture or an alloy that does not possess eutectic properties. Accordingly, when a non-eutectic alloy solidifies, its components solidify at different temperatures, and the overall composition exhibits a melting range.

The terms "powder" or "particle" or "particulate" refers to solidified metallic constituents in discrete forms, typically ranging from 1 nanometer to 100 micron in size.

The term "differential scanning calorimetry" ("DSC") refers to a method of thermal analysis in which the difference in the amount of heat required to increase the temperature of a sample and reference are measured as a function of temperature. DSC is used to investigate the melting behavior of alloy particles and the reaction signature of TLPS pastes formulated with metals and alloys.

The term "sintering" refers to a process in which adjacent surfaces of metal powder particles are bonded by heating. "Liquid phase sintering" refers to a form of sintering in which the solid powder particles coexist with a liquid phase. Densification and homogenization of the mixture occur as the metals diffuse into one another and form new alloy and/or intermetallic species.

In "transient liquid phase sintering" or "TLPS", the liquid phase exists for only a short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above the solidus temperature of the HMP metal.

"Heat of fusion" or "enthalpy of fusion" as used herein, refers to the energy required to change a substance from a solid state to a liquid state without changing its temperature. The temperature at which this occurs is the melting point. Thus, heat of fusion is a "latent heat," because during melting the introduction of heat cannot be observed as a temperature change and the temperature remains constant during the process.

"Solder" is a fusible metal alloy used to join together metal parts and having a melting point below that of the workpiece(s). Solder has a characteristic melting behavior that does not change substantially with repeated heat/cool cycles. Solder can include eutectic or non-eutectic alloys, but eutectic alloys are preferred for joining applications because the joints solidify quickly. TLPS differs from solder due to the presence of a HMP metal in TLPS compositions, which interact with a reactive LMP metal in the TLPS low melting temperature alloy to form crystalline intermetallics with specific stoichiometric proportions and much higher melting temperatures than the original TLPS composition. Thus, TLPS compositions generally do not remelt at the original process temperature. Although intermetallics can form within solder and between solder and elements in joined surfaces (e.g., copper pads), they represent only a small proportion of the soldered joint (<5%). Therefore, applied solder can be remelted under substantially the same conditions as the original application.

"Reflow" or "reflow soldering" as used herein, refer to a process which is used to attach one or several electrical components, for example, to contact pads or another substrate, wherein the assembly of attached components and substrate/contact pads is subjected to controlled heat sufficient to cause the solder to melt, flow, and solidify, forming a permanent electromechanical bond between the parts and solder.

The terms "ductility" or "ductile" refer to a solid material's ability to deform under tensile stress; this is typically characterized by the material's ability to be stretched, e.g., into a wire. A similar, but distinguishable property of a solid material is "malleability" which is a material's ability to deform under compressive stress and is characterized by the material's ability to form a thin sheet by hammering or rolling.

The "Coefficient of Thermal Expansion" or "CTE" is a term of art describing a thermodynamic property of a substance. The CTE relates a change in temperature to the change in a material's linear dimensions.

The term "processing temperature" or "T1" as used herein in reference to TLPS compositions is a temperature at which two reactive metals (e.g. Cu and Sn) form intermetallic species.

The terms "intermetallics" or "intermetallic species" refer to a solid material, which is comprised of two or more metal atoms in a certain proportion that has a definite structure which differs from those of its constituent metals.

Compositions of the Invention

Invention compositions are a replacement for soft solder and metal-filled polymers in the attachment of semiconductor die to packaging elements. High volumetric metal loading and low porosity of invention compositions provides superior mechanical, electrical and thermal interconnection performance between the semiconductor and metal packaging elements.

In the instant invention, particles of a metal are admixed with lead-free metal alloy particles in a fluxing vehicle. At least one element within the lead-free metal alloy particles is reactive with the metal in the metal particles. As the temperature is raised to the melting point of lead-free metal alloy particles, the lead-free metal alloy particles become molten. The diffusion and reaction of the reactive element(s) from lead-free metal alloy particles and the receptive metal particles continues until the reactants are fully depleted, there is no longer a molten phase at the process temperature, or the reaction is quenched by cooling the mixture. After cooling the volume fraction of metal in the reacted material exceeds 60% of the total volume, and/or total volume fraction of voids in the reacted material is less than 10%. Subsequent temperature excursions of the reacted invention composition, even beyond the original melt temperatures, do not reproduce the original melt signature of the mixture.

The invention compositions overcome the problems of large voids and remelt in solder die attach materials, as well as the poor thermal performance from the passively loaded conductive adhesive compositions with relatively low metal loading percentages, while also providing conformance to common manufacturing schemes and compatibility with popular surface finishes. In the invention compositions, metal particles are blended with lead-free solder paste compositions and diluted with a fluxing vehicle solvent such that the net metal content after thermal processing is in excess of 60 volume percent. The invention compositions can be prepared in a paste consistency to facilitate application by common industry methods, such as dispensing and stencil printing. Once the paste is applied and the semiconductor and packaging element(s) have been assembled in the desired configuration, the assembly is subjected to a thermal excursion under a controlled thermal ramp and environment. During this thermal processing, the volatile portion in the fluxing vehicle is slowly evaporated, lead-free metal alloy particles melt, the LMP metal Y in the molten alloy diffuses into the adjacent surfaces of the metallic element M and reacts to form high-melting alloys. The remaining fluxing vehicle, and the flux chemistry filling the interstices between the particles, thermosets and becomes chemically inert. The resultant composition contains at least about 60% by volume metallurgically interconnected metal.

The invention compositions are superior to conventional particle-filled adhesives because the mechanical strength and the thermal and electrical performance are derived from the high volumetric loading of metallurgically interconnected pathways formed by the interdiffusion of the LMP metal (e.g., tin) in the lead-free alloy particles into the solderable surfaces of the semiconductor die, the package element(s), and the metal particles. In conventional particle-filled adhesives, the volumetric metal loading is constrained by the need to maintain the mechanical integrity of the polymer adhesive.

The invention compositions are superior to conventional lead-containing and lead-free solders because the invention compositions are lead-free and will not remelt when exposed to subsequent solder reflow profiles during component assembly to a module or printed circuit board.

The invention compositions differ from prior art compositions in that invention compositions have been specifically designed to meet the unique challenges of power semiconductor die attach such as very low void volume and a high volume of densely interconnected metal for high thermal and electrical performance. First, the low void percentage is a function of the controlled volatilization of the volatile fraction of the flux vehicle over the defined thermal processing regime. Further, the high volume fraction of interconnected metal is achieved by minimizing the non-volatile fraction of the fluxing vehicle and optimizing the ratio between lead-free metal alloy particles and metal particles. Finally, the particle size of the metal powders in the invention composition have been selected to provide improved bonding control and ease of application for die attach applications.

In the simplest terms the invention semiconductor die attach composition is a composition of metal powders and fluxing vehicle that, once reacted, forms a metallurgically interconnected network containing at least 60% volumetric metal (alloy+metal powder) fraction and/or less than 10% volume fraction of voids. The composition comprises:
  a. 80-99 percent by weight (wt %) of a mixture of metal particles comprising:
    i. 30-70 wt % of a lead-free, low melting point (LMP) particle composition comprising at least one LMP metal Y; and
    ii. 25-70 wt % of a high melting point (HMP) particle composition comprising at least one metallic element M that is reactive with the at least one LMP metal Y at a process temperature T1, wherein the ratio of wt % of M to wt % of Y is at least 1.0,
  b. 0-30 wt % of a metal powder additive A and
  c. a fluxing vehicle, wherein said fluxing vehicle comprises:
    i. a volatile portion, and
    ii. not more than 50 wt % of a non-volatile portion that becomes inert at T1.

In the practice of the invention, lead-free metal alloy particles, metal powder and fluxing vehicle can be mixed together to form a printable or dispensable paste. Typically, the mixture of lead-free metal alloy and metal particles will be present in at least about 80, or at least about 85, weight percentage of the composition and up to about 90, or up to about 95, or up to about 99, weight percentage of the composition. Typically, the lead-free metal alloy powder will be present in at least about 20, or at least about 30, weight percentage of the mixture and up to about 50, or up to about 60, or up to about 70, weight percentage of the mixture. Typically, the metal powder will be present in at least about 30, or at least about 40, weight percentage of the mixture and up to about 70, or up to about 80, weight percentage of the mixture. Typically, the fluxing vehicle will be present up to about 20, or up to about 10, or up to about 5, weight percent of the composition, of which not more than about 50, or about 25, or about 10, or about 5, weight percent of fluxing vehicles is non-volatile. Typically, the ratio of weight percentage of M to the weight percentage of Y in the composition is at least about 1.0, or at least about 1.3, or at least about 1.5.

The invention compositions can be advantageously used to connect the topside and/or backside of semiconductor chips to semiconductor packaging elements such as clips, lead frames or other substrates. Invention compositions are most advantageously used to form assemblies wherein both the topside and/or backside of the semiconductor chip and packaging element(s) are metallized with a solderable surface to facilitate thermal transfer and/or an electrical connection between the semiconductor chip and packaging elements. This configuration enables the invention compositions to form a continuous metallurgically interconnected pathway from the metallization on the semiconductor die, through the bulk of the joint, and to the metallization on the package element.

Invention compositions may be paste-based or converted to a film. The invention compositions may be screen or stencil printed, dispensed, jetted, pick-and-placed, laminated and the like, to form patterned deposits on the semiconductor chip surface, packaging element surface, or on a temporary carrier to which the semiconductor chip and packaging elements may then be attached. Volatiles that are present in the flux vehicle composition are evolved either in a b-staging process or during a ramp in temperature to the peak temperature $T1$. $T1$ is equal to or greater than the melting temperature of lead-free metal alloy particles. In solder reflow, the peak reflow temperature is typically selected to be 5-50° C. in excess of the melting temperature of lead-free metal alloy particles to ensure that all the particles become molten and fluid. This peak temperature is also appropriate for the invention compositions, but a longer total process cycle time may be required to effect the evolution of the volatile constituents for a desired low volume percentage of voids and to develop the interdiffused metallurgical structure.

During the thermal processing excursion of invention compositions, the LMP metal (e.g., tin) in lead-free metal alloy particles undergoes interdiffusion with the remaining metal particles in the composition resulting in the irreversible formation of new alloy compositions with melting temperatures vastly in excess of the reflow processing temperature. It is this feature that enables invention compositions to be used for semiconductor die attach into a packaged component without remelting during subsequent reflow operations when the packaged component is assembled to a circuit board.

Lead-free metal alloy particles may also contain elements that are non-reactive with the metal particles. Typical elements that may be alloyed with the reactive element may include Bi, Ag, Cu, Sb, Au or combinations thereof. Typically, these additional, non-reactive elements are incorporated to achieve a particular process temperature, to improve wetting to preferred metallic surfaces such as copper, or to manipulate the mechanical properties of the thermally processed composition. Specific alloying elements may be advantageous in one aspect, such as affording a low process temperature, but detrimental in another aspect such as wetting and adhesion to particular surface finishes. The specific alloying elements are, therefore, specific to the particular requirements of the application.

The presence of voids in the finished joint between the semiconductor die and the package element is generally detrimental to the thermal performance and may create an initiation point for mechanical failure. The invention composition may be processed in a manner similar to the thermal profiles typically used for solders or in a manner consistent with a conductive adhesive. The thermal profile used should be selected to limit the total volume of voids in the reacted composition to less than about 10%, or less than about 5%. The cooling rate from the peak temperature of the profile to room temperature should be selected to prevent damage to the semiconductor chip as a result of thermal shock, and, for example, is less than about 6° C. per second, or between about 2.17 and about 3.25° C. per minute. It will be appreciated that the optimal cooling rate may depend on the type of processing employed (e.g., much slower in adhesive-type processing than for reflow-type processing) and the specific semiconductor die and package form factors.

Thermosetting Properties of TLPS Compositions

The compositions of the present invention are based on the observation that TLPS compositions can be processed at a temperature, $T1$, to connect electronic components and the resulting processed connections will be stable upon subsequent heating to temperature $T1$ and even higher temperatures. In other words, once metallurgically processed, TLPS compositions do not melt when heated beyond the process temperature. Thus, the TLPS compositions behave like "thermosets", rather than "thermoplastics".

The skilled artisan will recognize that "thermosets" irreversibly "cure" upon application of heat to become insoluble, hardened forms, while "thermoplastics" melt when heated, solidify when sufficiently cooled and can be remelted and resolidified repeatedly. Although this terminology is typically used to describe polymer adhesives, it is used herein to describe metallurgical compositions used to connect, for example, electronic components and other metallic elements.

Conventional metallic solder can be characterized as "thermoplastic". Solder is melted to join metal parts together and solidifies upon cooling to hold those parts in place; yet when subsequently reheated, solder re-melts. In contrast, TLPS compositions behave like thermosets. When heated, TLPS compositions melt sufficiently to join metal parts together, and solidify upon cooling to hold those parts in place. However, during the melting process, TLPS compositions undergo irreversible metallurgical changes that can be considered "curing" with the result that the "cured" or processed TLPS composition will not melt upon re-heating.

In certain embodiments of the invention, conventional solder pastes containing low melting point (LMP) lead-free metal alloys, are combined with reactive metal particles in proportions that convert the solder to a "thermosetting" form, which irreversibly "cures" during a typical solder reflow cycle. This "thermosetting" behavior results in a joint that does not remelt at the original reflow temperature and thus is suitable for secondary assembly cycles at the same reflow temperature as well as for high operating temperature applications.

In conventional solder reflow, the reflow temperature is typically selected to be 5-50° C. in excess of the melting temperature of the solder paste to ensure that all the particles become molten and fluid. When invention compositions are used in place of solder paste for the attachment of electronic components, standard solder reflow practices may be followed.

In the practice of the invention, the high-melting-point metal M, and at least one LMP metal Y, are selected so that the products of the transient liquid phase sintering reaction will have the optimum combination of attributes for the intended application. Key attributes that may be contemplated for the selection of M encompass characteristics such as thermally stable resistance, ductility, high electrical and thermal conductivity, coefficients of thermal expansion similar to the surrounding materials, and others that may be desirable under specific circumstances.

The invention compositions undergo a thermosetting reaction under solder reflow conditions to form a mixture of crystalline intermetallic and alloy products (i.e., new alloys formed during TLPS reaction) that all have substantially higher melting temperatures than the initial lead-free metal alloy particle melt temperature, and vastly in excess of reflow processing temperatures. The alloy products formed during TLPS processing have a substantially different composition than the original mixture of LMP and HMP metal particles. This reaction is irreversible and the processed composition does not melt significantly during subsequent high temperature exposures. It is this feature that enables invention compositions to be used for standard reflow attachment of electronic components without remelting during subsequent reflow operations. Invention compositions, therefore, enable step soldering operations and high operating temperature electronic assemblies to be fabricated under standard industry solder reflow conditions without the use of lead, expensive elements such as gold, or exotic alloys.

The crystalline intermetallics that are formed during solder reflow using invention compositions comprise unit cells of fixed elemental proportions and structure in a multiplicity that defines a grain size. Crystalline intermetallics are strong, but brittle materials. When intermetallics are formed at the interface between a standard solder paste and a components attachment pad, large grains are typically grown with laminar interfaces with the pad and bulk solder. These laminar interfaces are susceptible to crack formation and propagation. With the invention compositions; however, the reactive metal powder nucleates a large multiplicity of small disordered grains in different orientations. The growth of this multiplicity of grains is limited by the volume of reactive metal in each particle. The random orientation of each grain prevents the small grains from merging into a few large grains. This multiplicity of small, disordered grains promotes the formation of a strong joint that is not as susceptible to crack propagation as would a few large grains along a laminar interface.

Typically, the heat of fusion of the invention composition at the melting temperature of lead-free metal alloy particles is reduced by at least 70% during the initial solder reflow process. During initial processing, the TLPS composition exhibits a significant heat of fusion peak at the melting temperature of the lead-free metal alloy particles. After processing, the heat of fusion upon reheating to the melting temperature of the lead-free metal alloy is reduced substantially even when normalized for the proportion in the total composition.

The energy required to change a gram of a substance from the solid to the liquid state without changing its temperature is called heat of fusion. The heat of fusion for any material is specific to that material. The expression of heat of fusion of the LMP metal within a TLPS composition will be dependent on the proportion of the LMP metal in the total composition. The depletion of the LMP metal phase in any given TLPS composition after processing, due to the reaction of M and Y to form intermetallic species, may be determined by comparing the heat of fusion of a sample of the unprocessed composition to that of one that has been processed at T1. Because the heat of fusion of the LMP metal in the unprocessed composition may be masked by the vigorous energy release associated with the TLPS reaction of Y and M, it is often useful to use the heat of fusion of pure LMP metal and then normalize this value according to the weight percentage of LMP metal in the composition to obtain a value for the unprocessed TLPS composition.

High Melting Point Metal

HMP metals (M) include, but are not limited to, Cu, Ag, Pd, Au, Al, Ni, Be, Rh, Co, Fe, Mo, W, Mn and Pt. Typically, the HMP metal used in the compositions of the present invention is Cu, Ag, Pd, Au, Al, Ni or Pt, and most frequently the HMP metal is Cu, Ni or Ag. The HMP particles comprising M may be substantially elemental M, may be M alloyed with other elements, may be M coated onto a non-metallic or other core particle, or may be M coated itself with another element, inorganic coating or organic coating. The use of multiple HMP metals is contemplated in order to obtain TLPS reaction products with optimal characteristics. For instance, in some applications the mechanical strength of the processed composition is less important than the electrical conductivity, or the thermal conductivity may be more important than the ductility. As it is often necessary to optimize one property at the expense of another, the individual constituents may be selected to give optimal performance in the intended application according to properties of the elements that are well-known in the art. Silver, gold, palladium, nickel and aluminum are specifically contemplated for use in the compositions and methods of the invention, either alone or in various combinations, including combinations with copper.

In the present invention, Cu is the preferred element for (M), although other metals are contemplated as the application warrants. The use of additional high melting point metals in combination with the copper is also contemplated in order to obtain metallic reaction products with the lead-free solder with optimal characteristics such as a low CTE or composite modulus. Ag, Au, Pd, Ni, Al, Fe, Mn, Mo, and W are also specifically contemplated for use as the primary or an alloying metal element.

Low Melting Point Metal

Ideally, to substitute in existing lead-free solder reflow processing in use by the electronics industry, the LMP metal used in the TLPS compositions of the invention is one that is commonly used in the fabrication of lead-free solder pastes. Exemplary LMP solder paste alloys (Y/X) include, but are not limited to, Sn/Ag/Cu, Sn/Cu, Sn/Ag, Sn/Sb, Sn/In, Sn/Bi, Sn/Bi/Ag. While it is advantageous to use commercially available alloys, the invention can be practiced with any suitable alloy. The exact proportions of the constituents may vary and custom alloys are contemplated by the invention. In the representation "Y/X" for lead-free metal alloy particles, "X" represents at least one metal that forms an alloy with Y. In some embodiments of the invention, X represents one, two, three or more alloying metals. For example, Y/X is used herein to represent various alloys of Y in where Y is tin, and X is a single metal, for example, copper (Sn/Cu), silver (Sn Ag), antimony (Sn/Sb), indium (Sn/In), and bismuth (Sn/Bi). Y/X is also used to represent various alloys of Y is tin and X represents two metals, such as silver and copper (Sn/Ag/Cu; e.g., SAC), and silver and bismuth (Sn/Bi/Ag).

Exemplary reactive elements (Y) in LMP lead-free metal alloys include the following metals: Sn, Zn, Ga, In, alone or in an alloy form with (X). Typically, Y in the compositions of the present invention is Sn, or In and most frequently the Y is Sn in an alloy form Y/X. In certain embodiments of the invention, the reactive metal Y is Sn, which is present in the form of a low melting temperature alloy Y/X, and the reactive HMP metal M is Cu, Ni or Ag. In one embodiment of the invention, Y/X is SAC (Sn/Ag/Cu) and M is Cu.

Metal Additives

Aspects of the invention are based on the observation that inclusion of a metal additive can improve the properties of processed TLPS compositions, such as ductility. Thus, beneficial metal additives (A) are incorporated into the TLPS metallurgy via blending of additive elemental or alloy powders with the predominant metal M and Y or alloy powder Y/X constituents described above. Such metal additives A participate in the invention metallurgy, either as inherently reactive constituents or as constituents made reactive by coating, alloying or pseudo alloying with a reactive metal element. Additive metals include Cu, Ag, In, Pd, Au, Ni, Ce and Pt. Other metals such as Be, Rh, Co, Fe, Mo, W, and Mn are also contemplated as additives if alloyed, pseudo alloyed, or coated with a metal that can react with either M or Y.

A primary purpose of the additive metal particle A is to provide a ductile phase within the matrix of crystalline intermetallic reaction products formed by reaction of M and Y upon processing the TLPS compositions of the invention. In order to be effective in improving the ductility of the overall composition, the additive particle A must be metallurgically bonded into the matrix. If A is not bonded into the matrix, a crack that forms and propagates through the brittle crystalline phases (e.g., intermetallic) will merely circumvent the ductile additive particle A rather than reaping the benefit of the more ductile phase. However, when additive particle A is bonded to the matrix, the increased ductility imparted by the additive ductile phase mediates crack propagation and allows the joint to withstand increased mechanical strain.

In certain embodiments of the invention, partial remelting of the invention composition after reflow is not detrimental, for instance when there is little mechanical load on the TLPS joint in a secondary reflow operation. In such applications, an excess of the element Y or alloy Y/X may be incorporated to provide a ductile phase. Ductility may also be imparted by an element that is alloyed with Y in a LMP alloy Y/X, whereby the ductile phase X is made available when Y is depleted by reaction with M.

When incorporation of a ductile phase other than an excess of the element Y or alloy Y/X is desirable, there are at least two means of incorporation. The first method is to incorporate one or more HMP metal(s) in a bimodal particle size distribution (i.e., small and large particles containing the HMP metal). The smaller particles of HMP metal serve as the HMP metal M TLPS reagent that reacts with Y, while the larger particles of HMP metal are too large to be effectively converted to intermetallic species. Therefore, larger particle size of HMP metal that function as metal additives A reacts only on the particle surface while the bulk remains unreacted, ductile metal. The two sizes of HMP metal particles may be the same or different HMP metals.

The second method for creating a ductile phase is to incorporate into the invention compositions a ductile material that is not reactive with Y or M, but is coated, alloyed or pseudo alloyed with a reactive metal as metal additive A particles. In this alternative, the reactive metal that is coated, alloyed, or pseudo alloyed reacts into the matrix metallurgically, leaving the ductile material intact to form a ductile phase.

The foregoing methods of incorporation of an additive A may also be employed to control other characteristics of the processed composition such as coefficient of thermal expansion and the like.

Particle Size, Shape and Ratios

High-melting-point metal M, the metal Y or alloy Y/X, and optional metal additive A are introduced into the composition as particles (e.g. powders). The particles may be spherical, irregular, flakes, spongiform, rods and other forms known to those of skill in the art. The particles of HMP metal M, may be substantially elemental, may be alloyed with other elements, may be deposited onto a non-metallic or other core particle as a coating, or may itself be coated with another element, inorganic coating or organic coating. Likewise, LMP metal Y or alloy comprising Y/X may be a binary alloy consisting exclusively of a metallic element X and reactive, LMP metallic element Y, or may be alloyed with other constituents, may be deposited onto a non-metallic or other core particle as a coating, or may itself be coated with another element, inorganic coating or organic coating.

A critical feature of the invention compositions is that particle size distribution is controlled makes them suitable for creating a thin, consistent bond line between the flat surface of a semiconductor die and the joining surface. The particles, such as powders, of HMP metal M, and the LMP metal Y or alloy Y/X typically have a nominal diameter between about 0.1 µm up to about 100 µm. More often the metal powders have a nominal size between 1 µm and 50 µm.

In some embodiments, two or more sizes of particles are present in the TLPS compositions, including a variety of particles sizes and particle mixtures that include particles throughout the range of about 1 nm to about 100 µm, about 10 nm to about 100 µm, about 100 nm to about 75 µm, about 1 µm up to about 75 µm, and about 1 µm to about 50 µm. In some instances, strict control of the particle size distribution, generally achieved through hard sieving, can be used to render the TLPS compositions of the invention suitable for deposition techniques such as dispensing, ink jetting and the like. Typically the average particle size of HMP metal M, LMP metal Y or alloy Y/X, and metal additive A is 1-50 micron; most often it is in the range of 5-20 micron.

Methods of Making High Temperature Solder/TLPS Compositions

The present invention also provides methods for preparing the TLPS compositions described herein by providing at least one HMP metal M in particulate form; at least one LMP metal alloy Y/X in particulate form; optionally, metal additive A in particulate form; and a fluxing vehicle; and combining the particles and fluxing vehicle in the disclosed proportions, based on the total weight of the composition.

The present invention also provides methods for preparing the TLPS composition disclosed herein, including the steps of:
1. providing at the least one HMP metal M in particulate form, at least one LMP metal Y and/or alloy Y/X in particulate form, an fluxing vehicle, and one or more metal additive A in particulate form; and 2. combining the particles and fluxing vehicle in the noted proportions, based on the total weight of the composition.

The alloys contemplated for the compositions of the invention are generally available commercially.

Particle Coatings

Coatings may be present on either or both of the first and second particles, comprising M and Y, respectively, and/or on metal powder additive A. Coatings contemplated for use include metals, inorganic coatings, organic coatings and organo-metallic coatings. Preparing the particles with a coating can be used, for example, to introduce an additional metallic element into the TLPS compositions of the invention in order to alter the properties of the processed metallic matrix, protect the particles from oxidation, prevent the metals or metal oxides from premature reaction with the organic constituents, facilitate dispersion of the particles in the matrix, maintain the particles in suspension, impart lubricity to the composition, prevent agglomeration of the particles, and the like. The particular selection of the presence and type of coating is dependent on the application contemplated for the TLPS composition, the method of deposition and the chemistry of the fluxing vehicle—all of which are within the knowledge of the skilled artisan. Metals (such as tin and silver), phosphorous containing moieties such as self-assembling phosphonate monolayers, saturated and unsaturated fatty acids, inorganic and organic metal salts, metal alkoxides, triazoles, and polyaniline are all specifically contemplated as components of useful coatings according to the present invention.

Fluxing Vehicle

The fluxing vehicle for the invention composition acts as a carrier for the metallic particles, serving to hold the mixture together for ease of application and to keep the various particles in close proximity to each other. The fluxing vehicle also serves to make the metallic reagents available for reaction and to protect them from the environment, much as a solvent does in an organic reaction. Several factors determine the selection of an appropriate solvent for an organic reaction (e.g. polarity, protic or aprotic, miscibility with water, etc.). Likewise, the fluxing vehicle in the compositions of the present invention is selected for appropriate attributes. The most critical attribute of the fluxing vehicle is that it must remove the metallic oxides from the surfaces of the metallic reagents to make said reagents available for reaction. Removal of the metallic oxides is referred to as "fluxing" and may be accomplished by a variety of chemical species known to those of skill in the art, including organic acids and strong bases.

In order to achieve a useful paste consistency while also effecting a joint with a maximum metallic content, the fluxing vehicle comprises one or more volatile components. The volatile components may be active species that serve as fluxing agents or may be chemically inert materials such as solvents. During thermal processing of the invention compositions, the volatile constituents evaporate gradually over the controlled ramp and peak temperature conditions such that very little void space is created in the thermally processed joint.

The fluxing vehicle may include thermoplastic polymer materials that allow the TLPS composition to be shaped as desired prior to processing, and may contain polymer precursors and/or other compounds and solvents that react to form interdisposed deposits within the metallic network during processing.

Applications of Inventive TLPS Compositions

The metallurgical networks formed from the TLPS compositions of the invention are useful for electrically, thermally and/or mechanically connecting elements within electrical structures. The present invention provides compositions for connecting a variety of electronic parts for applications where high operating temperatures may be encountered, including but not limited to step-soldering, down-hole, oil drilling, electronic controls, automotive underhood, smart-grid distribution, and aerospace applications.

Exemplary applications in which inventive compositions may be used include connecting semiconductor dies to packaging elements, forming connections between stacked die and the like.

The compositions of the present invention can be advantageously used to connect metallized semiconductor die to leads, circuit boards, lead frames, clips, interposers, additional die, or other substrates. Invention compositions are most advantageously used to connect semiconductor die when the assemblies thus connected will be subjected to a subsequent assembly operation that requires another solder reflow and/or when the assembly will be used in a harsh operating environment.

The above-described compositions can be applied using various techniques, including, but not limited to, needle dispensing, stenciling, screen printing, ink jetting, lamination, extrusion, casting, spraying or other methods that would be known to those of skill in the art, such as methods that form patterned deposits to which electronic components may then be attached. Once applied, the described compositions are thermally processed in an oven, in a reflow furnace, on a hot plate, in a lamination press, or by other means typically employed for the processing of solder or metal filled organic adhesives. The specific thermal process conditions are dependent upon the application as well as selection of the metal system and any organic binder constituents.

After deposition, metallic semiconductor die or packaging elements are contacted with the deposited invention composition to form an assembly. The compositions of the invention may then be thermally processed to a temperature $T1$ in an oven, in a reflow furnace, in thermocompression equipment, on a hot plate, in a lamination press, or by any other available means, such as means typically employed for the processing of solder or filled organic adhesives. The skilled artisan will be aware of additional methods that are typically employed for the processing of solder or filled organic adhesives that will be suitable for processing the TLPS compositions described herein. The specific thermal process conditions are dependent upon the application, intended use, the TLPS composition and any fluxing organic vehicle constituents. Typically, process temperature $T1$ is in the range from 100° C. to 300° C., more often in the range of 150° C. to 280° C., and most often in the range of 200° C. to 280° C.

FIG. 1 depicts an exemplary use of the invention composition to connect one semiconductor die to two packaging elements. Semiconductor die 40 is metallized (30 and 50) on both major surfaces to provide electrical and thermal interconnection points. Invention composition 20 is disposed between metallic package element 10 and metallization 30 on the semiconductor die 40. Invention composition 20 is also disposed between metallization 50 on the semiconductor die 40 and metallization 60 on a non-metallic packaging element 70. In FIG. 1, invention composition is depicted as it would be prior to thermal processing to T1; wherein the individual particles are still dispersed in the fluxing vehicle.

Figure 2:
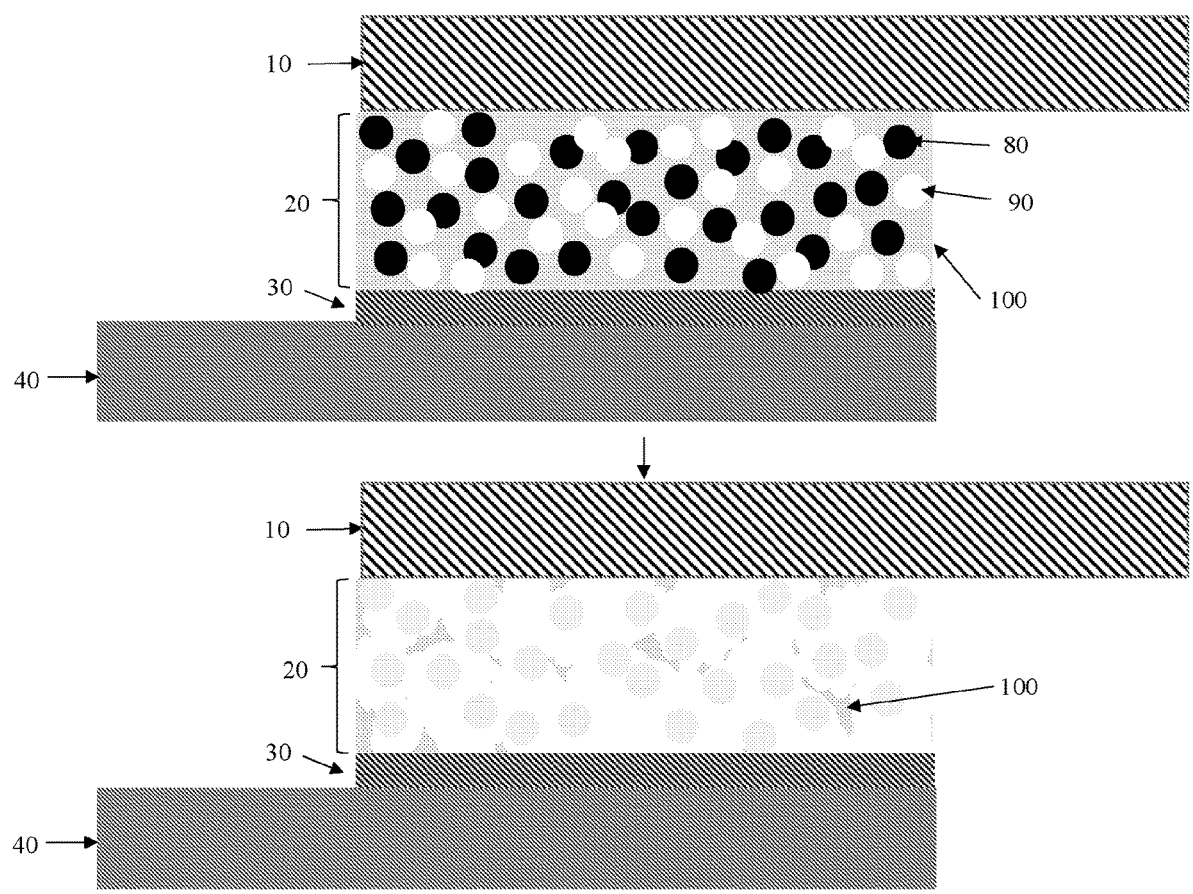
FIG. 2 depicts the transition between the invention compositions as prepared and after thermal processing at T1.

FIG. 2 depicts the transition between the invention compositions as prepared and after thermal processing at T1. In each depiction, the invention composition 20 is disposed between metal packaging element 10 and the metallization 30 on the semiconductor die 40 surface. Prior to thermal processing at T1, individual particles of HMP metal 80 and LMP metal 90 are apparent in flux vehicle 100. After thermal processing at T1, the individual particles have undergone interdiffusion to form a metallurgically interconnected structure from the metal packaging element 10, through the invention composition deposit 20 and to the metallization 30 on the semiconductor die 40 surface.

The invention will now be further described with reference to by the following illustrative, non-limiting examples.

TABLE 1

| Component | Comp. A Wt % | Comp. B Wt % | Comp. C Wt % | Comp. D Wt % |
|---|---|---|---|---|
| Phenol/tert amine | 2.2 | 2.37 | 2.31 | 4.24 |
| $C_{6-20}$ fatty acid/tert amine | 0.73 | 0.79 | 0.77 | 0.71 |
| Silicon Antifoaming agent | 0.15 | 0.16 | | 0.14 |
| Cycloaliphatic epoxy | | | | 2.83 |
| Cycloaliphatic epoxy cationic catalyst | 0.07 | 0.08 | 0.08 | 0.07 |
| Epoxy resin/epoxy acrylic diluent | 2.93 | 3.95 | 3.08 | 2.12 |
| Acrylic resin | 2.93 | 3.16 | 2.46 | |
| Copper | 36 | 46.75 | 49 | 44.3 |
| SnBi eutectic alloy | | | | 22.1 |
| SAC alloy | | 15 | 20 | 23.5 |
| Sn/Bi non-eutectic alloy | 40 | 27 | 22 | |
| Fumed silica | | 0.75 | | |

Characteristics of Comparative Examples A-D are given in Table 2. The metal percentage is delineated both before and after thermal processing, and the density differences of the different metal and polymer constituents are normalized to provide metal volume fraction after processing.

TABLE 2

| | Unit | Comp. A | Comp. B | Comp. C | Comp. D |
|---|---|---|---|---|---|
| Metal wt % | Wt % | 91 | 88.75 | 91 | 90 |
| Metal wt % post cure/reflow/sintering | Wt % | 92.2 | 91.8 | 92 | 91.8 |
| Metal vol % post cure/reflow/sintering | Vol % | 59.1 | 57.9 | 58.25 | 57.9 |
| Die shear strength at high temperature (260° C.) | kg/mm$^2$ | <1.5 | <1.0 | <1.0 | <1.0 |
| Bulk Thermal Conductivity (W/mK) | W/mK | 15 | 20 | 15~20 | 25 |
| Electrical Resistivity (uohm*cm) | uohm*cm | <100 | <100 | <100 | <100 |
| Change Rdson Post Stress Testing | | >10 | >10 | >10 | >10 |
| Reliability | | Failed Level 2 & 3, 1000 cycles (−65° C.~150° C.) | Failed Level 2 & 3, 500 cycles (−55° C.~125° C.) | Failed Level 2 & 3, 500 cycles (−65° C.~150° C.) | Failed Level 2 & 3, 250 cycles (−65° C.~150° C.) |
| Remark | | Lead-free | Lead-free | Lead-free | Lead-free |

Although the foregoing invention has been described in some detail by way of illustration and example for purposes of clarity and understanding, it will be apparent to those of ordinary skill in the art in light of the teaching of this invention that certain changes and modifications may be made thereto without departing from the spirit or scope of the appended claims.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Comparative Examples A-D

Four comparative pastes (A-D) were prepared by admixing the components listed in Table 1 in a container using a dual planetary mixer under vacuum.

Table 2 shows that a low volume metal loading leads to poor electrical reliability, which means greater than 10% Rdson change during reliability testing. It is notable in these examples that compositions with poor reliability performance have low metal volume percentage after thermal processing. The compositions of examples in Table 1 have 10-11 weight percentage of flux vehicle remaining in the sintered composition which results in a relatively low post-processing metal volume percentage.

Examples 1-4

Four compositions of the invention were prepared by admixing the components listed in Table 3 in a container using a dual planetary mixer under vacuum.

TABLE 3

| Component | Ex. 1 Wt % | Ex. 2 Wt % | Ex. 3 Wt % | Ex. 4 Wt % |
|---|---|---|---|---|
| Phenol/tert amine | 2.75 | 1.58 | 2.78 | 0.74 |
| $C_{6-12}$ fatty acid/tert amine | 0.92 | 0.53 | 0.93 | |
| Oleic/TEOA (C6-20 fatty acid/tert amine) (Flux 3) | | | | 0.25 |

TABLE 3-continued

| Component | Ex. 1 Wt % | Ex. 2 Wt % | Ex. 3 Wt % | Ex. 4 Wt % |
|---|---|---|---|---|
| Glycol ether solvent | 5.5 | 5.26 | 5.56 | 4.43 |
| Cycloaliphatic epoxy cationic catalyst | | 0.05 | | 0.02 |
| BisF epoxy | 0.37 | 2.11 | 0.37 | |
| Fluorinated hydrocarbon surfactant | 0.09 | 0.05 | | 0.1 |
| Epoxy resin/epoxy acrylic diluent | | | | 1.23 |
| Acrylic resin | | | | 0.98 |
| Copper | 54 | 54 | 56 | 62 |
| SAC alloy | 36 | 36 | 34 | 30 |
| Polyamide Thixotropic agent | 0.37 | 0.42 | 0.37 | 0.25 |

Characteristics of Examples 1-4 are given in Table 4. The metal percentage is delineated both before and after thermal processing, and the density differences of the different metal and polymer constituents are normalized to provide metal volume fraction after processing.

TABLE 4

| | Unit | Ex. 1 | Ex. 2 | Ex. 3 | Ex. 4 |
|---|---|---|---|---|---|
| Metal, wt % | Wt % | 90 | 90 | 90 | 92 |
| Metal wt % post cure/reflow/sintering | Wt % | 96.3 | 95.74 | 96.7 | 97.48 |
| Metal vol % post cure/reflow/sintering | Vol % | 75.90 | 72.8 | 77.66 | 82.0 |
| Die shear strength at high temperature (260° C.) | kg/mm² | >1.5 | >1.5 | >1.5 | >1.0 |
| Bulk Thermal Conductivity | W/mK | 30 | 25 | 30 | 25 |
| Electrical Resistivity | uohm*cm | 50 | 60 | 40 | 50 |
| Change Rdson Post Stress Testing | | <10% | <10% | <10% | <10% |
| Reliability | | Level 1, 2 or 3, 2000 cycles −65° C.~150° C. | Level 1, 2 or 3, 2000 cycles (−65° C.~150° C.) | Level 2, 1000 TC cycles (−65° C.~150° C.) | Level 2, 1000 TC cycles (−65° C.~150° C.) |
| Remark | | Lead-free | Lead-free | Lead-free | Lead-free |

As a result of the comparative examples in Table 2, a new approach was taken to ensure increased metal volume percentage post sintering. By substantially reducing the amount of fluxing organic vehicle and replacing it with a volatile solvent to maintain the paste consistency of the compositions, the volume percentage of metal post-processing was raised sufficiently to achieve the desired performance. Unexpectedly, the proportion of flux in the composition could be reduced well below what is typically used in solder paste without a detrimental effect on the desired TLPS reaction between the metal elements. This reduction in the fluxing organic vehicle also resulted in the post-process organic phase being relegated to isolated pockets rather than a continuous phase. As a consequence, the post-process composition is unexpectedly mechanically dominated by the interconnected metallic network rather than behaving as a composite, unlike the prior art metal-filled polymer adhesives. Table 4 showed the result of electrical and reliability performance in pastes having a higher metal volume percentage post sintering.

The lead-free pastes of the present invention with both a high volumetric metal loading and utilizing a mixture of lead-free metal particles perform at least as well in mechanical and electrical reliability testing as lead-containing solder pastes. As can be observed through the examples in Table 4, the invention compositions achieve an unexpected combination of high levels of adhesion and high electrical and thermal conductivity compared with silver-epoxy adhesives, and prior art TLPS compositions that lead to a successful reliability result.

We claim:

1. A semiconductor die attach composition with greater than 60% metal volume after thermal reaction comprising:
   a. 80-99 percent by weight (wt %) of a mixture of metal particles comprising:
      i. 30-55 wt % of a lead-free, low melting point (LMP) metal alloy particle composition comprising at least one LMP metal Y selected from the group consisting of Sn, Zn, Ga, In, and combinations thereof; and
      ii. 25-50 wt % of a high melting point (HMP) particle composition comprising at least one metallic element M selected from the group consisting of Cu, Ag, Pd, Au, Al, Ni, Be, Rh, Co, Fe, Mo, W, Mn, Pt and combinations thereof, wherein M is reactive with the at least one LMP metal Y at a process temperature T1 in the range of 100° C. to 300° C.,
      wherein the ratio of wt % of M to wt % of Y in the composition is at least 1.0,
      iii. 20-45 wt % of a metal powder additive A comprising Be, Rh, Co, Fe, Mo, W, or Mn that has been alloyed, pseudo alloyed, or coated with a metal that can react with either M or Y, and
   b. a fluxing vehicle, wherein said fluxing vehicle comprises:
      i. a volatile portion selected from the group consisting non-reactive solvents, and
      ii. not more than 50 wt % of a non-volatile portion that becomes inert at T1 selected from the group consisting of carboxylic acids, phenols, and combinations thereof,
      wherein the fluxing vehicle is present in an amount of 1-20 wt %.

2. The composition of claim 1, wherein said metal element M undergoes interdiffusion with at least one LMP metal Y at T1 such that the products formed from such interdiffusion have a melting point in excess of T1.

3. The composition of claim 1, wherein said LMP particle composition does not contain bismuth beyond trace detectable levels.

4. The composition of claim 1, wherein the at least one M is selected from the group consisting of Cu, Ag, Pd, Au, Al, Ni, Pt and combinations thereof.

5. The composition of claim 1, wherein the at least one Y is selected from the group consisting of Sn, In and combinations thereof.

6. The composition of claim 1, wherein T1 is in the range of 150° C. to 280° C.

7. The composition of claim 1, wherein the maximum particle size of the metal powder is 50 microns.

8. A structure comprising the composition of claim 1 disposed between a semiconductor die bearing metallization on at least one major surface and a package element bearing metallization on at least one major surface.

9. A method comprising the step of processing the structure of claim 8 at a peak temperature of T1 to effect a continuous metallurgically interconnected pathway from said die bearing metallization to said package element bearing metallization.

10. The method of claim 9, wherein T1 is between 150° C. and 280° C.

11. The method of claim 9, wherein the duration of time at peak temperature T1 is from 15 to 75 minutes.

12. The method of claim 9, wherein the ramp rate to reach peak temperature T1 is between 2.67 and 4.4° C. per minute.

13. The method of claim 9, wherein the cooling rate to return to room temperature from T1 is between 2.17 and 3.25° C. per minute.

* * * * *